US011289814B2

(12) United States Patent
Adams et al.

(10) Patent No.: US 11,289,814 B2
(45) Date of Patent: Mar. 29, 2022

(54) SPIRAL ANTENNA AND RELATED FABRICATION TECHNIQUES

(71) Applicant: RAYTHEON COMPANY, Waltham, MA (US)

(72) Inventors: Peter J. Adams, Hudson, NH (US); Thomas V. Sikina, Acton, MA (US); John P. Haven, Lowell, MA (US); James E. Benedict, Lowell, MA (US)

(73) Assignee: RAYTHEON COMPANY, Waltham, MA (US)

( * ) Notice: Subject to any disclaimer, the term of this patent is extended or adjusted under 35 U.S.C. 154(b) by 582 days.

(21) Appl. No.: 16/180,822

(22) Filed: Nov. 5, 2018

(65) Prior Publication Data
US 2019/0148832 A1 May 16, 2019

Related U.S. Application Data

(60) Provisional application No. 62/584,260, filed on Nov. 10, 2017.

(51) Int. Cl.
H01Q 9/27 (2006.01)
H05K 1/02 (2006.01)
H05K 3/42 (2006.01)
H05K 3/40 (2006.01)
H01Q 1/38 (2006.01)

(52) U.S. Cl.
CPC ............... H01Q 9/27 (2013.01); H01Q 1/38 (2013.01); H05K 1/0219 (2013.01); H05K 1/0221 (2013.01); H05K 1/0224 (2013.01); H05K 3/4038 (2013.01); H05K 3/421 (2013.01)

(58) Field of Classification Search
CPC .. H01Q 9/27; H01Q 1/38; H05K 1/02; H05K 3/40; H05K 3/42
USPC ........................................................ 343/895
See application file for complete search history.

(56) References Cited

U.S. PATENT DOCUMENTS

| 4,647,878 A | 3/1987 | Landis et al. |
| 4,875,087 A | 10/1989 | Miyauchi et al. |
| 5,401,175 A | 3/1995 | Guimond et al. |
| 5,426,399 A | 6/1995 | Matsubayashi et al. |
| 5,828,555 A | 10/1998 | Itoh |
| 5,857,858 A | 1/1999 | Gorowitz et al. |

(Continued)

FOREIGN PATENT DOCUMENTS

| CN | 201845850 U | 5/2011 |
| CN | 106936521 A | 7/2017 |

(Continued)

OTHER PUBLICATIONS

Bailey, M. "General Layout Guidelines for RF and Mixed-Signal PCBs", Maxim Integrated (2011), pp. 1-10. Retrieved from URL: <<https://pdfserv.maximintegrated.com/en/an/AN5100.pdf>>.

(Continued)

Primary Examiner — Andrea Lindgren Baltzell
(74) Attorney, Agent, or Firm — Lando & Anastasi, LLP

(57) ABSTRACT

The concepts, systems, circuits and techniques described herein are directed toward a spiral antenna which may be provided using additive manufacturing technology so as to provide an antenna capable of operation at frequencies which are higher than spiral antennas manufactured using standard photo-etch or printed circuit board (PCB) manufacturing processes.

4 Claims, 7 Drawing Sheets

(56) References Cited

U.S. PATENT DOCUMENTS

| | | | |
|---|---|---|---|
| 6,000,120 | A | 12/1999 | Arledge et al. |
| 6,137,453 | A * | 10/2000 | Wang ................... H01Q 1/36 |
| | | | 343/700 MS |
| 6,353,189 | B1 | 3/2002 | Shimada et al. |
| 6,400,234 | B1 | 6/2002 | Ohhashi et al. |
| 6,421,018 | B1 | 7/2002 | Zeilinger et al. |
| 6,429,819 | B1 | 8/2002 | Bishop et al. |
| 6,486,755 | B2 | 11/2002 | Aruga |
| 6,614,325 | B1 | 9/2003 | Kocin |
| 6,651,322 | B1 | 11/2003 | Currie |
| 6,674,347 | B1 | 1/2004 | Maruhashi et al. |
| 6,747,217 | B1 | 6/2004 | Jochym et al. |
| 6,937,120 | B2 | 8/2005 | Fisher et al. |
| 7,038,622 | B2 | 5/2006 | Schmidt et al. |
| 7,405,477 | B1 | 7/2008 | Tao et al. |
| 7,443,279 | B2 | 10/2008 | Yagisawa et al. |
| 8,390,529 | B1 | 3/2013 | Paulsen et al. |
| 8,749,434 | B2 | 6/2014 | Han et al. |
| 10,505,255 | B2 | 12/2019 | Baheti et al. |
| 2003/0043084 | A1 | 3/2003 | Egashira |
| 2003/0067410 | A1 | 4/2003 | Puzella et al. |
| 2003/0188889 | A1 | 10/2003 | Straub et al. |
| 2003/0201851 | A1 | 10/2003 | Yoshida et al. |
| 2004/0217823 | A1 | 11/2004 | Tayrani et al. |
| 2006/0033670 | A1 | 2/2006 | Schadler |
| 2006/0044083 | A1 | 3/2006 | Kuzmenka |
| 2006/0066495 | A1 | 3/2006 | Isoifovich et al. |
| 2006/0214744 | A1 | 9/2006 | Margomenos |
| 2006/0273864 | A1 | 12/2006 | Zimmerman et al. |
| 2007/0194999 | A1 | 8/2007 | Morton |
| 2009/0000804 | A1 | 1/2009 | Kobayashi et al. |
| 2009/0009261 | A1 | 1/2009 | Song |
| 2009/0295500 | A1 | 12/2009 | Ives |
| 2010/0182105 | A1 | 7/2010 | Hein et al. |
| 2010/0206617 | A1 * | 8/2010 | Johnson ............... H05K 1/0221 |
| | | | 174/251 |
| 2010/0254094 | A1 | 10/2010 | Ohhira |
| 2011/0193649 | A1 | 8/2011 | Popelka et al. |
| 2013/0009729 | A1 | 1/2013 | Kim |
| 2013/0154773 | A1 | 6/2013 | Siprak |
| 2014/0240056 | A1 | 8/2014 | Isom et al. |
| 2015/0189754 | A1 | 7/2015 | Bohra et al. |
| 2015/0323576 | A1 | 11/2015 | Bulja et al. |
| 2016/0079646 | A1 | 3/2016 | Ichige |
| 2016/0172741 | A1 | 6/2016 | Panat et al. |
| 2017/0117620 | A1 | 4/2017 | Lapushin |
| 2018/0086628 | A1 | 3/2018 | Vossough et al. |
| 2018/0323128 | A1 | 11/2018 | Dias et al. |
| 2019/0148807 | A1 | 5/2019 | Sikina et al. |
| 2019/0150271 | A1 | 5/2019 | Azadzoi et al. |
| 2019/0269007 | A1 | 8/2019 | Sikina et al. |
| 2020/0028257 | A1 | 1/2020 | Benedict et al. |

FOREIGN PATENT DOCUMENTS

| | | |
|---|---|---|
| CN | 206742473 U | 12/2017 |
| EP | 1202377 A2 | 5/2002 |
| EP | 1473979 A1 | 11/2004 |
| GB | 2322237 A | 8/1998 |
| JP | 10-041630 A | 2/1998 |
| JP | 2002-530982 A | 9/2002 |
| JP | 2014-203982 A | 10/2014 |
| WO | 2015147219 A1 | 10/2015 |

OTHER PUBLICATIONS

International Search Report in application No. PCT/US2019/019851 dated May 29, 2019.

Jung et al. "Inkjet-printed resistors with a wide resistance range for printed read-only memory applications", Organic Electronics (2013) vol. 14, pp. 699-702.

Kim et al. "Fabrication of Fully Inkjet-Printed Vias and SIW Structures on Thick Polymer Substrates", IEEE Transactions on Components, Packaging and Manufacturing Technology (2016) vol. 6, No. 3, pp. 486-496.

International Search Report and Written Opinion in application No. PCT/US2019/019847 dated May 29, 2019.

Kangasvieri et al. "An Ultra-Wideband BGA-Via Transition for High-Speed Digital and Millimeter-Wave Packaging Applications", IEEE (2007), pp. 1637-1640.

International Search Report and Written Opinion in application No. PCT/US2018/059636 dated Mar. 4, 2019.

Farhan Shafique et al. "Laser machining of microvias and trenches for substrate integrated waveguides in LTCC technology", Proceedings of the 39th European Microwave Conference (2009), pp. 272-275.

Deslandes et al. "Integrated Microstrip and Rectangular Waveguide in Planar Form", IEEE Microwave and Wireless Components Letters (2001) vol. 11, No. 2, pp. 68-70.

International Search Report and Written Opinion in application No. PCT/US2018/059625 dated Mar. 4, 2019.

Leib et al. "An ultra-wideband vertical transition from microstrip to stripline in PCB technology", Proceedings of 2010 IEEE International Conference on Ultra-Wideband (2010), p. 1-4.

International Search Report and Written Opinion in application No. PCT/US2018/059240 dated Mar. 4, 2019.

Mukherjee et al. "Broadband Substrate Integrated Waveguide Cavity-Backed Bow-Tie Slot Antenna", IEEE Antennas and Wireless Propagation Letters (2014) vol. 13, p. 1152-1155.

Liu et al. "Broadband Circularly Polarized Antenna With High Gain for Ku-band Applications", IEEE Conference Proceedings (2017), p. 1-2.

Kim et al. "Slot-Coupled Circularly Polarized Array Antenna With Substrate-Integrated Waveguide Cavity for Parallel-Plate-Mode Suppression", IEEE Transactions on Antennas and Propagation (2017) vol. 65, No. 8, p. 3999-4006.

Luo et al. "Antenna Array Elements for Ka-band Satellite Communication on the Move", Loughborough Antennas & Propagation Conference (2013), p. 135-139.

Beeresha et al. "Embedded Microstrip Line to Stripline Vertical Transition Using LTCC Technique", International Journal of Research in Engineering and Technology (2015) vol. 4, Issue 12, pp. 30-34.

Shan et al. "A Compact Broadband Stripline-fed Slot Antenna for Array Application", IEEE International Workshop on Antenna Technology (2005), pp. 555-558.

International Search Report and Written Opinion in application No. PCT/US2018/059602 dated Apr. 18, 2019.

Hong et al. "Grid Assembly-Free 60-GHz Antenna Module Embedded in FR-4 Transceiver Carrier Board", IEEE Transactions on Antennas and Propagation (2013) vol. 61, No. 4, pp. 1573-1580.

Invitation to Pay Additional Fees in application No. PCT/US2018/059410 dated Apr. 23, 2019.

International Search Report and Written Opinion in application No. PCT/US2018/059841 dated Mar. 4, 2019.

Sitaraman et al. "Modeling, Design and Demonstration of Integrated Electromagnetic Shielding for Miniaturized RF SOP Glass Packages", Electronic Components & Technology Conference (2015), p. 1956-1960.

* cited by examiner

SPIRAL ANTENNA AND RELATED FABRICATION TECHNIQUES

CROSS-REFERENCE TO RELATED APPLICATIONS

This application claims priority to U.S. Provisional Patent Application No. 62/584,260 filed Nov. 10, 2017, entitled SPIRAL ANTENNA AND RELATED FABRICATION TECHNIQUES, which is incorporated by reference herein in its entirety.

GOVERNMENT RIGHTS

Not applicable.

BACKGROUND

As is known in the art, a so-called spiral antenna is a type of radio frequency (RF) antenna provided from a substrate having two or more conductors disposed thereover in a spiral shape. As is also known, an upper operating frequency of a spiral antenna is defined by the inner radius ($r_i$) of the antenna where the smaller the radius, the higher the operating frequency. Limitations in conventional manufacturing techniques (e.g., standard photo-etch or printed circuit board (PCB) manufacturing processes), however, limit the inner radius size of spiral antennas which may be achieved thereby limiting the upper operational frequency of a spiral antenna.

SUMMARY

In accordance with the concepts systems, circuits and techniques described herein, a spiral antenna comprises an antenna substrate having two or more spiral conductors disposed on a first surface thereof, each of the spiral antennas having a first (or inner) end which defines an inner radius of the spiral and a second (or outer) end which defines an outer radius of the spiral. A second surface of the antenna substrate is disposed over a first ground plane surface of a feed circuit substrate. The first end of each spiral conductor has a vertical launch feed line coupled thereto. Each vertical launch feed line is coupled to a feed circuit disposed in or on the feed circuit substrate. A Faraday wall having a cylindrical shape is disposed between the first ground plane of the feed circuit substrate and the first surface of the antenna substrate and surrounds the vertical launch feed lines. A feed circuit Faraday wall is disposed between ground planes of the around the feed circuit and surrounds the feed circuit.

With this particular arrangement, a spiral antenna and feed circuit are provided. The Faraday walls disposed around the antenna feed circuit and vertical launch feed lines increase the amount of isolation between signals propagating in different portions of the circuit.

In accordance with a further aspect of the concepts described herein, an additive manufacturing technique (AMT) to fabricate a spiral antenna comprises removing (e.g., via a milling technique) conductive material from an antenna substrate to form two or more conductive spirals on the substrate; at a first end of each spiral conductor, forming (e.g., via a milling technique) an opening in the substrate which extends from a first surface to a second opposing surface of the substrate; forming (e.g., via a milling technique) an opening which surrounds each of the openings which terminate at a first end of the spiral, said opening having a cylindrical shape; and filling each of the opening with a conductive ink so as to form conductive signal paths and conductive walls in the antenna substrate.

With this particular technique, an AMT fabrication approach provides an antenna having lower fabrication cost in production, can be rapidly prototyped, and customized to meet design needs. AMT is used to miniaturize component dimensions to operate at frequencies in the range of about 25 GHz and higher which are higher frequencies of operation heretofore achievable with spiral antennas.

Thus, the use of AMT to fabricate a spiral antenna pushes past the current manufacturing limitations due to the use of standard photo-etch or printed circuit board (PCB) manufacturing processes.

The antenna described herein solves the problems associated with conventional PCB manufacturing by utilizing design features (e.g., vertical launch feed circuits, Faraday walls, etc.) which use at least milling and printing capabilities provided by AMT. Such milling and printing capabilities of AMT machines allow for the manufacture of feature sizes needed for an antenna operating at frequencies in the range of about 25 GHz to about 25 GHz. In embodiments, using the designs and techniques described herein, it is possible to achieve dimensions of about 0.002" for trace widths and about 0.005" for diameters of vertical launch feed circuits.

Furthermore, printed conductive Faraday walls are used to confine electric fields and can be produced in the same manufacturing step as milling the other features. This saves significant labor costs which drive down the overall cost of the assembly. Finally, a custom printed connector interface is used so that a standard coaxial connector can be used to test the device.

The antenna design described herein uses AMT techniques, such as Faraday walls, vertical-launch connections, single-step mill and fill operations, small (2×2 element) building blocks, and milled copper traces. It represents an antenna structure that is fully manufactured using AMT to reliably produce components in a cost-effective manner. Furthermore, antenna designs which utilizes AMT are significantly lower cost in production, can be rapidly prototyped, and customized to meet design needs. The spiral antenna design described herein uses AMT to miniaturize component dimensions to operate at frequencies above operational frequencies of prior art spiral antennas.

Prior art designs do not have the combination of miniature feature sizes, printed conductive elements, rapid prototyping capability, and connection to standard connectors.

By a utilizing an antenna design that uses the capabilities provided by AMT (e.g., milling and printing capabilities of AMT machines), the antenna described herein solves problems associated with conventional PCB manufacturing. In particular the use of AMT milling and printing capabilities allows for the manufacture of an antenna having smaller feature sizes needed for an antenna operating at frequencies above 26.5 GHz.

In embodiments, the dimensions can be miniaturized down to 0.002 inch for trace widths and 0.005 inch for via diameters (i.e., vertical launch feed line diameters). Printed conductive Faraday walls are used to confine electric fields and can be produced in the same manufacturing step as milling the other features. This saves significant labor costs which drive down the overall cost of an antenna assembly. Finally, a custom printed connector interface is used so that a standard coaxial connector can be used to test the device.

The use of AMT to manufacture a spiral antenna of the type described herein, pushes past the current limitations of standard photo-etch or printed circuit board (PCB) manufacturing processes thereby enabling the manufacture of spiral antennas having dimensions which all operation at RF frequencies above 26.5 GHz and even above 30 GHz.

One aspect of the disclosure is directed to a spiral antenna comprising an antenna substrate having a first surface and a second surface, two or more spiral conductors disposed on the first surface of the antenna substrate, each of the spiral antennas having a first end which defines an inner radius of the spiral and a second end which defines an outer radius of the spiral, a feed circuit substrate disposed over the second surface of the antenna substrate, a feed circuit disposed in or on said feed circuit substrate, a vertical launch feed line having a first end coupled to the first end of each spiral conductor and a second end coupled to the feed circuit, and a vertical launch feed line Faraday wall surrounding the vertical launch feed line.

Embodiments of the spiral antenna further may include the feed circuit substrate having a first ground plane and a second ground plane. The vertical launch feed line Faraday wall may have a cylindrical shape disposed between the first ground plane of the feed circuit substrate and the first surface of the antenna substrate. The feed circuit may include two feed lines, a first end of a first spiral conductor of the two or more spiral conductors being coupled to a first feed line and a first end of a second spiral conductor of the two or more spiral conductors being coupled to a second feed line. The feed circuit Faraday wall may surround the two feed lines. The spiral antenna further may include a feed circuit Faraday wall disposed between the first and second ground planes of said feed circuit substrate and the around the feed circuit. The spiral antenna further may include a feed circuit Faraday wall disposed between the first and second ground planes of the feed circuit substrate and around the feed circuit.

Another aspect of the disclosure is direct to a spiral antenna comprising an antenna substrate having a first surface and a second surface, two or more spiral conductors disposed on the first surface of the antenna substrate, each of the spiral antennas having a first end which defines an inner radius of the spiral and a second end which defines an outer radius of the spiral, a feed circuit substrate disposed over the second surface of the antenna substrate, the feed circuit substrate having a first ground plane and a second ground plane, a feed circuit disposed in or on said feed circuit substrate, and a feed circuit Faraday wall disposed between the first and second ground planes of said feed circuit substrate and the around the feed circuit.

Embodiments of the spiral antenna further may include a vertical launch feed line having a first end coupled to the first end of each spiral conductor and a second end coupled to the feed circuit. The spiral antenna further may include a vertical launch feed line Faraday wall surrounding the vertical launch feed line. The vertical launch feed line Faraday wall may have a cylindrical shape disposed between the first ground plane of the feed circuit substrate and the first surface of the antenna substrate. The feed circuit includes two feed lines, a first end of a first spiral conductor of the two or more spiral conductors being coupled to a first feed line and a first end of a second spiral conductor of the two or more spiral conductors being coupled to a second feed line. The feed circuit Faraday wall surrounds the two feed lines.

Yet another aspect of the disclosure is directed to an AMT processing for fabricating a spiral antenna, the process comprising: (a) removing conductive material from an antenna substrate to form two or more conductive spirals on the substrate; (b) at a first end of each spiral conductor, forming an opening in the substrate which extends from a first surface to a second opposing surface of the substrate; (c) forming an opening which surrounds each of the openings which terminate at a first end of the spiral, said opening having a cylindrical shape; and (d) filling each of the opening with a conductive ink so as to form conductive signal paths and conductive walls in the antenna substrate.

Embodiments of the process further may include forming a conductive vertical launch that is coupled to the spiral antenna and the signal paths. Removing conductive material, forming an opening in the substrate, and/or forming an opening which surrounds each of the openings may include a milling technique.

Another aspect of the disclosure is directed to a method of forming a conductive vertical launch that is coupled to a spiral antenna and a feed circuit. In one embodiment, the method comprises: pre-tinning a bottom trace of a feed circuit with a solder bump after a signal trace has been milled out of a double cladded dielectric substrate; drilling a hole in a top layer of the feed circuit and bonding film to allow room for the solder bump to reflow in a cavity during bonding; pre-cutting a cavity leading to the top layer with a spiral and laminating the assembly together; inserting or filling the hole with copper until the copper touches the solder bump; and pressing a top of the copper with a soldering iron to reflow the solder at the feed circuit.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. The foregoing features may be more fully understood from the following description of the drawings in which.

DETAILED DESCRIPTION

The concepts, systems, circuits and techniques described herein are directed toward a spiral antenna which may be provided using additive manufacturing technology so as to provide a spiral antenna capable of operation at frequencies which are higher than spiral antennas manufactured using standard photo-etch or printed circuit board (PCB) manufacturing processes.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom upper and lower, end, side, vertical and horizontal, and the like, are intended for convenience of description, not to limit the present systems and methods or their components to any one positional or spatial orientation.

Figure 1:
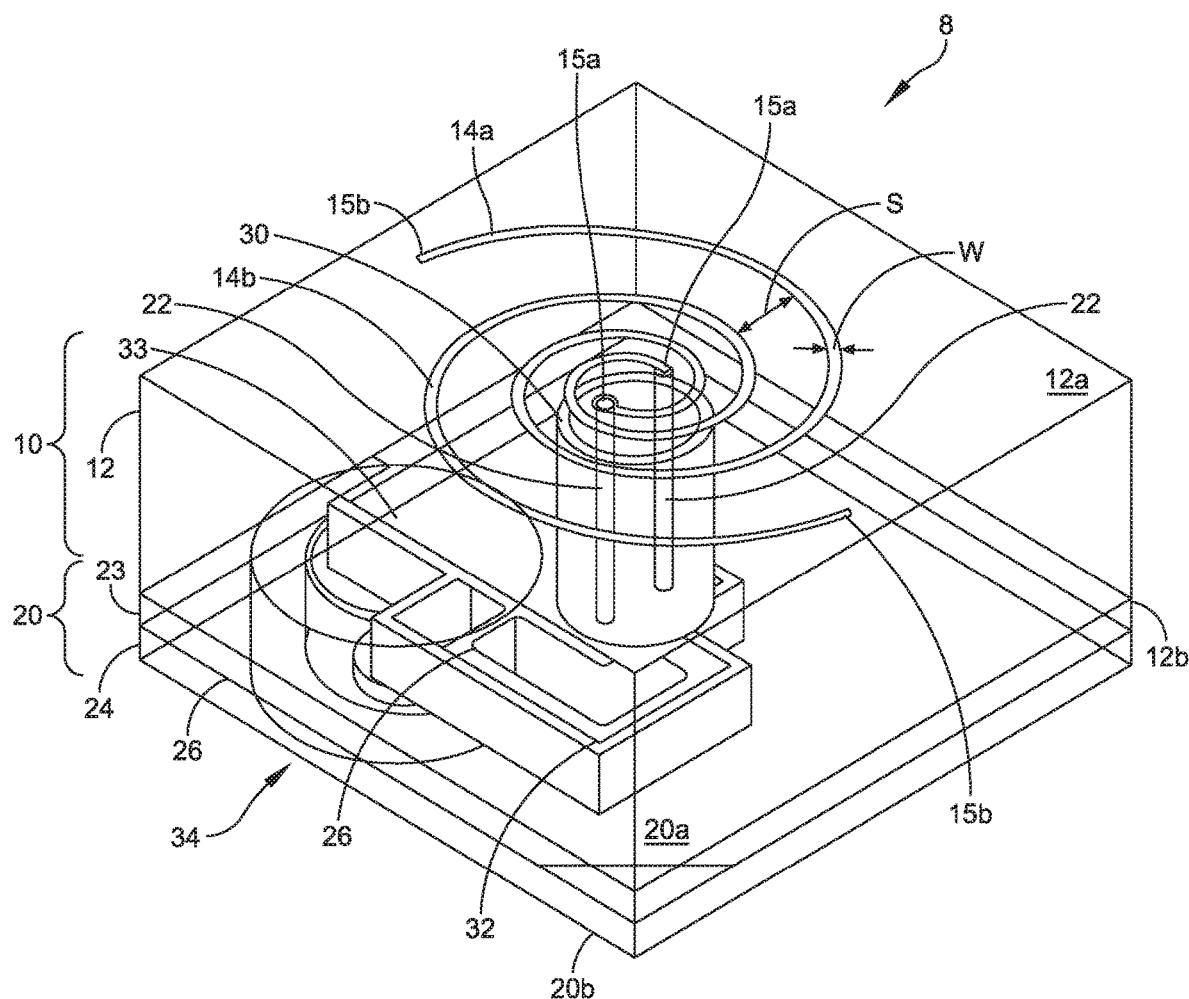
FIG. 1 is a transparent isometric view of a spiral antenna.

Referring now to FIG. 1, a spiral antenna assembly 8 includes a spiral antenna portion 10 coupled to a feed circuit portion 20. Spiral antenna portion 10 comprises an antenna substrate 12 having first and second opposing surfaces 12a, 12b with two or more spiral conductors 14a, 14b (generally denoted 14) disposed or otherwise formed on the first surface 12a of the antenna substrate 12. Although only two spiral conductors 14 are shown in the illustrative embodiment of FIG. 1, those of ordinary skill in the art will appreciates that any number N of spiral conductors 14 may be used. The particular number of spiral conductors 14 to use in any particular application depends upon a variety of factors including but not limited to radiating distance, transmit power, platform size.

Those of ordinary skill in the art will understand how to select the number of spiral conductors for a given application. Furthermore, those of ordinary skill will also appreciate how to select the particular spiral shape (e.g., Archimedean spiral, square spiral, star spiral etc.) to use in a particular application.

Each of the spiral conductors has a first (or inner) end 15a which defines an inner radius of the spiral and a second (or outer) end 15b which defines an outer radius of the spiral. Spiral conductor characteristics which affect the spiral antenna radiation pattern include, but are not limited to spacing between the turns, a width of each spiral conductors (or arm), inner radius $r_i$ and outer radius $r_o$. It should be appreciated that, depending upon the particular type of spiral antenna, the spacing s and width w may change at different points along the spiral. That is, in embodiments, the spiral conductors 14 may not maintain the same width throughout out the entire length of the spiral (where length of the spiral refers to the length of the spiral conductor 14 as measure along a centerline of the spiral conductor 14). Similarly, in embodiments the spacing between spiral conductors 14 may not be constant along the entire length of the spiral.

An inner radius $r_i$ of the spiral is measured from center of the spiral to center of the first turn while an outer radius of the spiral is measured from center of the spiral to center of the outermost turn. Other than these design parameters, spiral antennas have a lowest frequency of operation $f_{low}=c/2\pi r_o$ and a highest frequency of operation $f_{high}=c/2\pi r_i$. Here c corresponds to speed of light. In an r, θ coordinate system, the spiral grows along the r-axis and θ-axis simultaneously.

Antenna substrate 12 is disposed over and coupled to a first ground plane surface 20a of stripline feed circuit 20. In embodiments, the antenna may be coupled to stripline feed circuit 20 using vertical transitions to create a twin line feed 22. One particular technique to connect the spiral stripline feed circuit 20 is described below in conjunction with FIGS. 4-4D. Stripline feed circuit 20 includes a second ground plane surface 20b. Here, stripline feed circuit 20 is provided from a pair of substrates 23, 24 with feed circuitry 26 disposed therebetween.

The first end of each spiral conductor has a vertical launch feed line 22 coupled thereto. Each vertical launch feed line 22 is coupled to feed circuitry 26 provided as part of the stripline feed circuit 20. In this illustrative embodiment, the feed circuit is implemented as a stripline circuit comprising two dielectric substrates 23, 24 and having upper and lower ground planes 20a, 20b). In other embodiments, the feed circuit may be implemented using other techniques (e.g., as a microstrip feed circuit, as a suspended air stripline circuit or using other techniques). That is, it is recognized that it is possible to implement the feed as something other than a stripline circuit.

A Faraday wall 30 having a cylindrical shape is disposed between the first ground plane 20a of the stripline feed circuit substrate and the first surface 12a of the antenna substrate and surrounds (i.e., encompasses) the vertical launch feed lines 22. In preferred embodiments, Faraday wall 30 is provided having a solid cylindrical shape. In embodiments, it may be possible to provide cylindrical wall having gaps, slots or other forms of openings provided therein. In embodiments, one end of Faraday wall 30 is in electrical contact with feed circuit ground plane 20a and a second opposite end of the Faraday wall extends through antenna substrate 12, but does not extend to antenna substrate surface 12a. In embodiments, Faraday wall 30 may or may not be in physical contact with the second ground plane 20b. Such a conductive Faraday wall 30 confines electric fields to thus provide isolation and mode suppression. Faraday wall 30 thus serves as a vertical launch isolation and mode suppression structure and thereby aids in providing the antenna with desired antenna operating characteristics.

A feed circuit Faraday wall 32 is disposed between ground planes 20a, 20b of the stripline feed circuit 20 and surrounds or encases the feed circuitry 26. In embodiments, the Faraday wall 32 is in electrical contact with both the upper and power ground planes of the stripline circuit. In embodiments, the Faraday wall is in physical contact with both the upper and power ground planes of the stripline circuit. Similarly to Faraday wall 30, Faraday wall 32 confines electric fields from the feed circuitry 26. In embodiments, it may be possible to provide wall 32 having gaps, slots or other forms of openings therein.

Figure 1A:
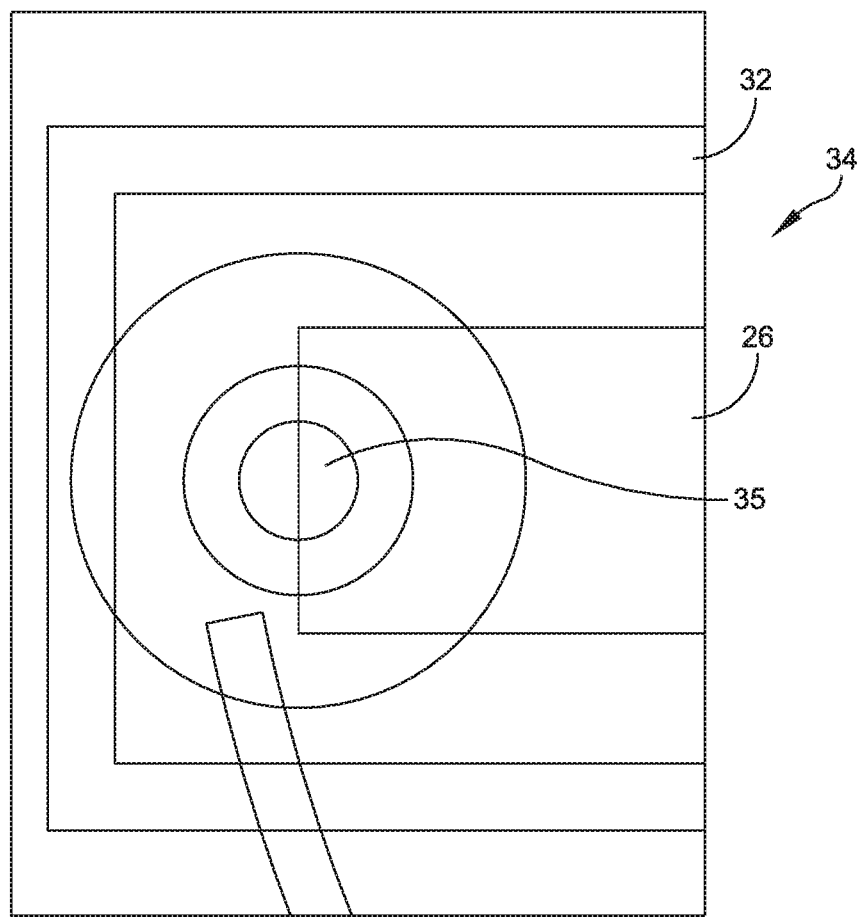
FIG. 1A is a bottom view of a connector interface to a stripline feed circuit.
Figure 1B:
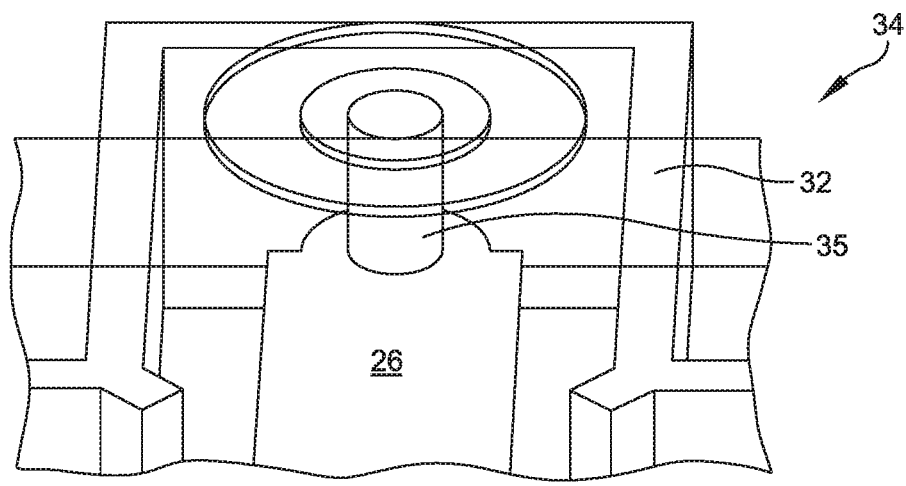
FIG. 1B is an isometric view of a connector interface to a stripline feed circuit.
Figure 1C:
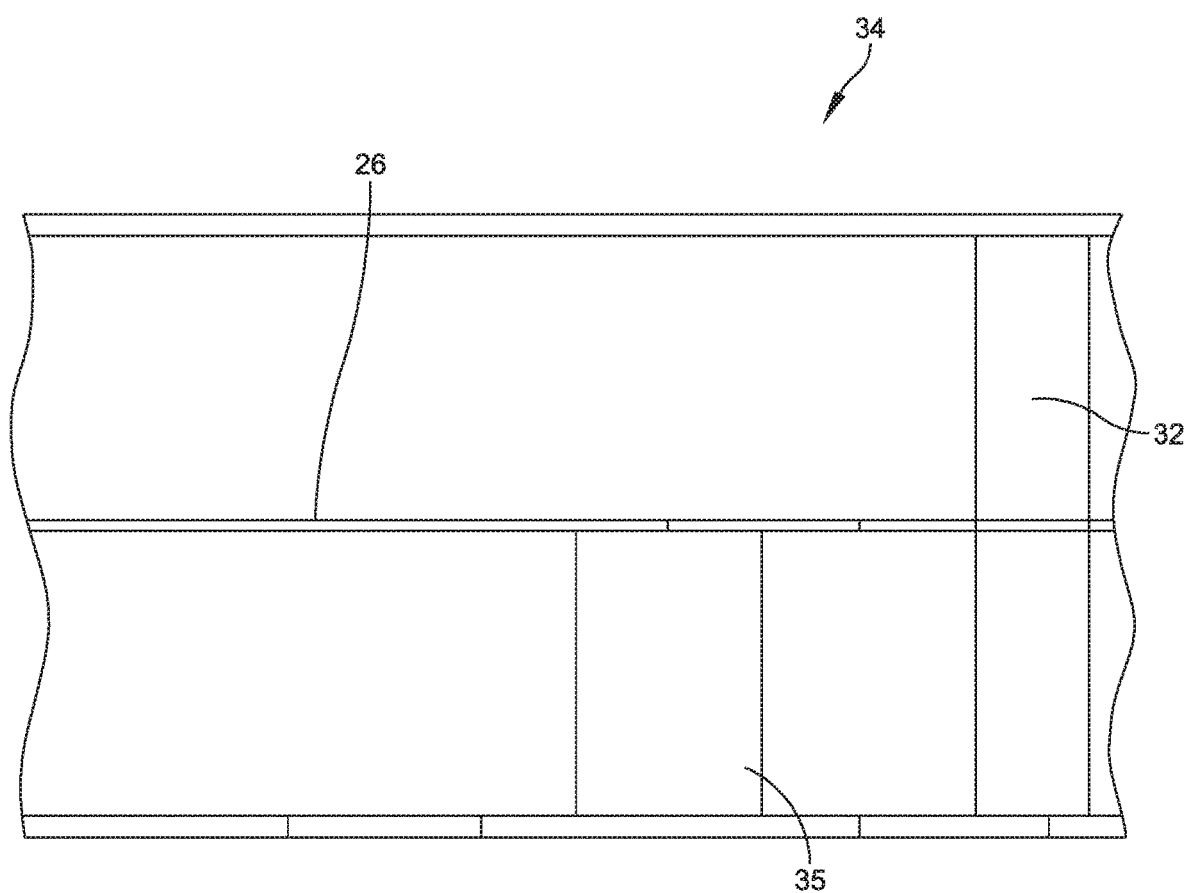
FIG. 1C is a side view of a connector interface to a stripline feed circuit.

An RF connector 33 is coupled to an input/output port 34 of feed circuitry 26. In embodiments, input/output port 34 is provided as a custom printed connector interface 34 which allows RF connector 33 to be provided as a standard coaxial connector. As illustrated in FIGS. 1A-1C, in which like elements of FIG. 1 are provided having like reference designations, the interface 34 uses an AMT produced vertical launch 35 to allow the adapter to interface with the stripline feed.

It should be appreciated that different spiral antenna designs can be obtained by varying the number of turns it contains, the spacing between its turns and the width of its arm. It should also be appreciated that the antenna substrate is selected having a specific permittivity and dimensions selected to provide the antenna having desired radiation pattern characteristics. In one embodiment, for operation over the frequency range of about 25 GHz to about 35 GHz, the antenna substrate 12 may be provided having a thickness of in the range of about 70-80 mils and a relative permittivity of about 2.2 and the spiral conductors 14 are provided having a width in the range of about 2-3 mils and an inner radius of about 0.055" and an outer radius of about 0.185", the feed substrate is provided having a thickness of about 20 mils.

Those of ordinary skill in the art will appreciate, of course, that a trade-off may be made between substrate thickness and relative permittivity values to achieve substantially the same antenna electrical characteristics (e.g., a relatively thin substrate having a relatively high relative permittivity value may be used to achieve substantially the same antenna operating characteristics as a relatively thick substrate having a lower relative permittivity.

In embodiments, the antenna described herein includes two conductive spirals (or "arms") extending from the center outwards and a Faraday wall having a cylindrical shape and disposed around antenna feed lines coupled to the arms. The antenna may be a flat disc, with spiral conductors disposed on a surface thereof, or the spiral conductors may extend in a three-dimensional shape e.g., as if disposed over a truncated cone shape structure. The direction of rotation of the spiral defines the direction of antenna polarization. Additional spirals may be included as well, to form a multi-spiral structure. In embodiments the spiral is cavity-backed; that is, there is a cavity of air or non-conductive material or vacuum, surrounded by conductive walls. The cavity changes the antenna pattern to a unidirectional shape.

In embodiments, the two substrates may be fabricated separately and then bonded together. Then the vertical transitions would be placed.

Figure 2:
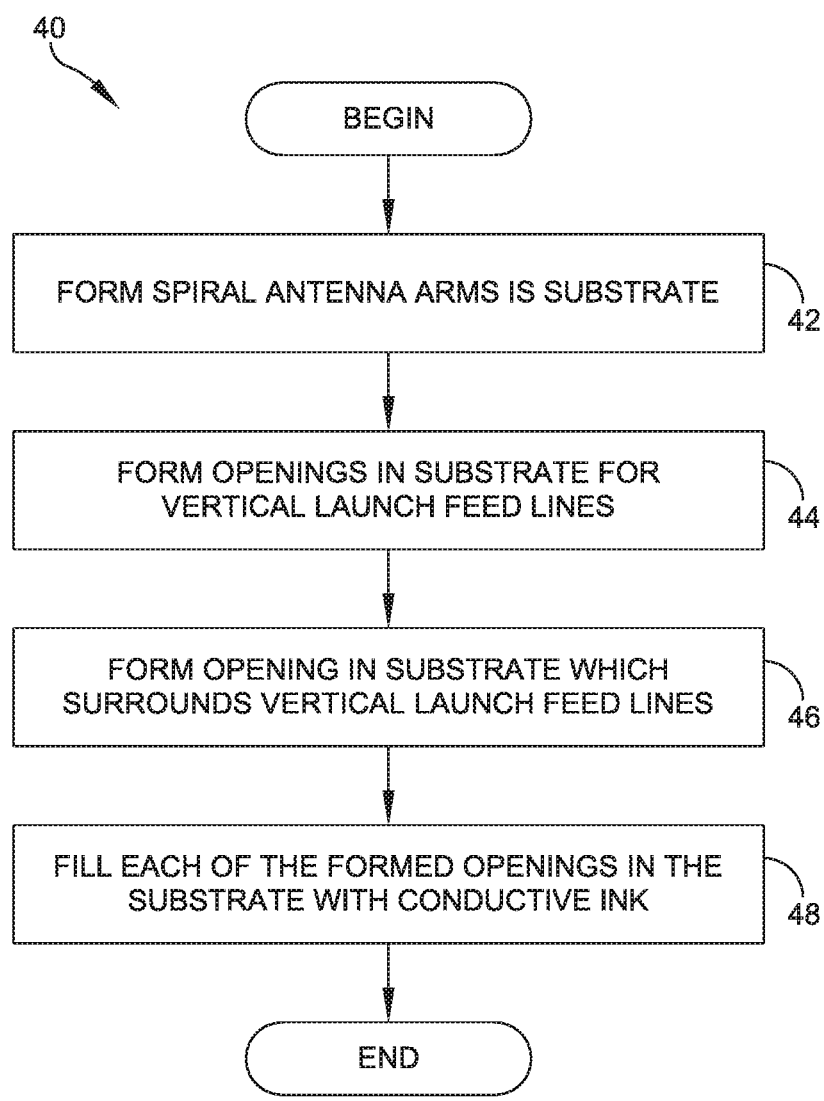
FIG. 2 is a flow diagram of a process for fabricating a spiral antenna which may be the same as, or similar to, the antenna of FIG. 1 using additive manufacturing techniques (AMT)

Referring now to FIG. 2, an illustrative additive manufacturing technique (AMT) 40 to fabricate a spiral antenna which may be the same as or similar to antenna 10 described above in conjunction with FIG. 1, processing begins with removing (e.g., via a milling technique) conductive material from a first surface of an antenna substrate to form two or more conductive spirals on the first surface of the substrate as shown in processing block 42. Thus, small feature sizes are achieved by milling away copper leaving spiral conductors.

As shown in processing block 44, at a first end of each spiral conductor, a milling (or other) technique may be used to form an opening in the antenna substrate which extends from a first surface to a second opposing surface of the antenna substrate. Such openings will later be used to form vertical launch feeds (e.g., vertical launch feeds 22 shown in FIG. 1).

As shown in processing block 46, a milling technique may be used to form an opening which surrounds each of the vertical launch feed openings. In embodiments, the opening which surrounds each of the vertical launch feed openings is provided having a continuous cylindrical shape and encircles the vertical launch feed openings. In embodiments, the cylindrical shaped opening extends from a second surface of the antenna substrate to a point 50%-95% through the antenna substrate (i.e., the cylindrical extends only partially through the antenna substrate).

After forming vertical launch feeds openings and the cylindrical opening in the antenna substrate, processing proceeds to processing block 48 in which a process to fill each of the openings with a conductive ink so as to form conductive signal paths and conductive walls in the antenna substrate is performed.

In embodiments, a series of cylindrical shaped openings, each having different diameters, may be formed in processing block 46 such that after being filled with conductive ink a segmented cylindrical wall is disposed about the vertical launch feed lines. It should be appreciated that the wall is more of a cylindrical ring with the two cylindrical openings of the vertical transitions residing inside.

Figure 3:
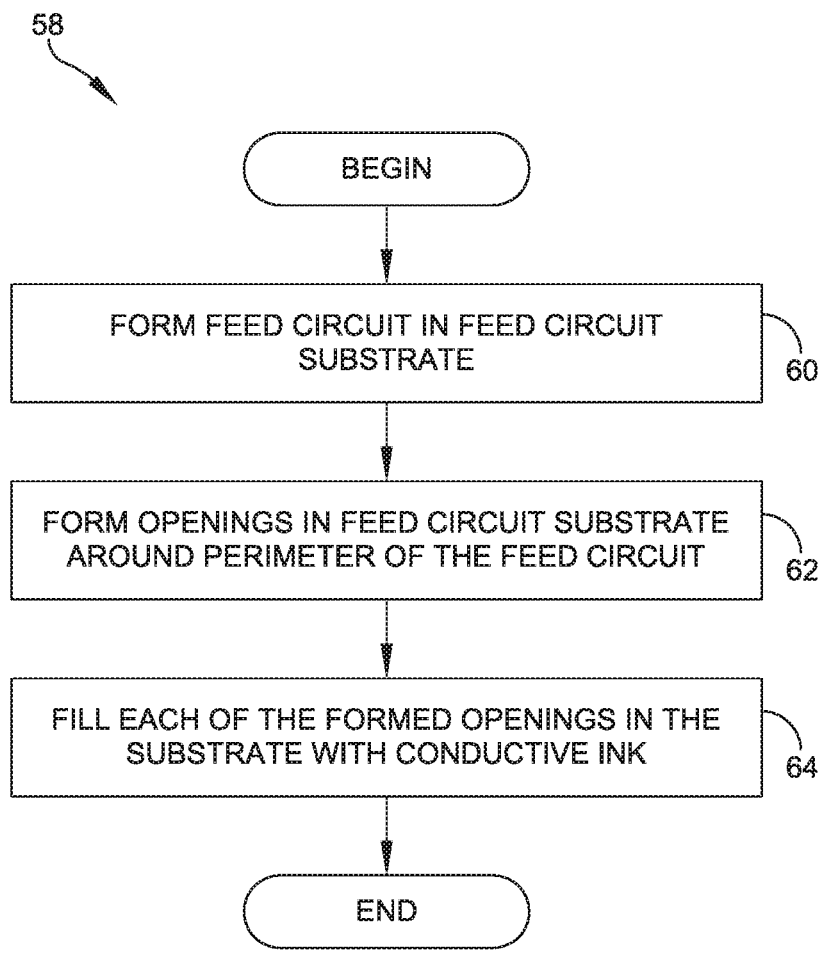
FIG. 3 is a flow diagram of a process to fabricate a feed circuit which may be the same as, or similar to, the feed circuit of FIG. 1 using AMT.

Referring now to FIG. 3, an illustrative AMT approach 58 to fabricate a feed circuit which may be the same as or similar to feed circuit 20 described above in conjunction with FIG. 1, processing begins by with removing (e.g., via a milling technique) conductive material from an feed circuit layer to form feed circuitry (e.g., circuitry 26 in FIG. 1) as shown in processing block 60. In embodiments, the stripline feed is copper which is not milled away by the AMT milling process.

As shown in processing block 62, an opening is formed around the perimeter of the feed circuit. In preferred embodiments, the opening is a continuous opening formed via a milling operation. Thus, a milling (or other) technique may be used to form an opening in the feed substrate which extends from a first surface to a second opposing surface of the feed substrate. Such openings will later be used to form a Faraday wall which surrounds the feed circuit (e.g., Faraday wall 32 shown in FIG. 1).

After forming openings in the feed substrate, processing proceeds to processing block 64 in which a process to fill each of the openings with a conductive ink so as to form conductive signal paths and conductive walls in the feed substrate is performed.

Thus, using AMT as described above, it is recognized that printed conductive Faraday walls may be formed in the same manufacturing step as milling the other features and that such Faraday walls may be used to confine electric fields in both antenna and feed circuits.

After forming a spiral antenna using the AMT technique of FIG. 2 and a feed using the AMT technique of FIG. 3, the so-formed spiral antenna and feed circuit may be joined via a bonding technique to provide an integrated spiral antenna assembly such as assembly 8 described above in conjunction with FIG. 1.

Figure 4:
FIGS. 4-4D are a series of diagrams illustrating a process to couple a spiral antenna to a feed circuit.
Figure 4A:
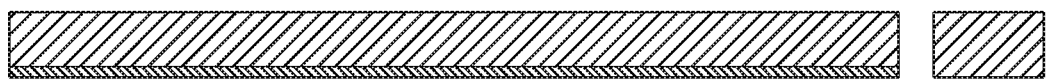
Figure 4A:
Figure 4B:
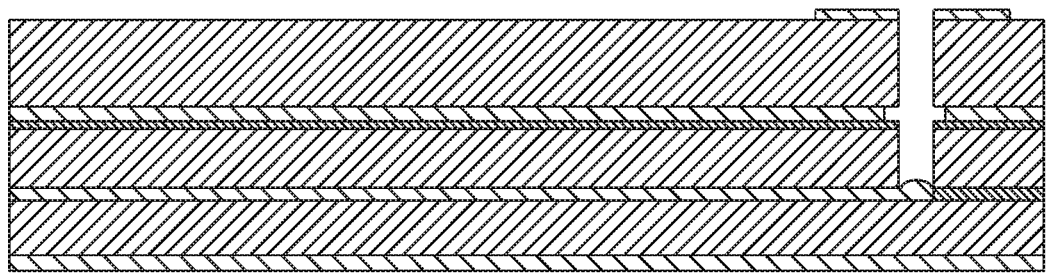
Figure 4C:
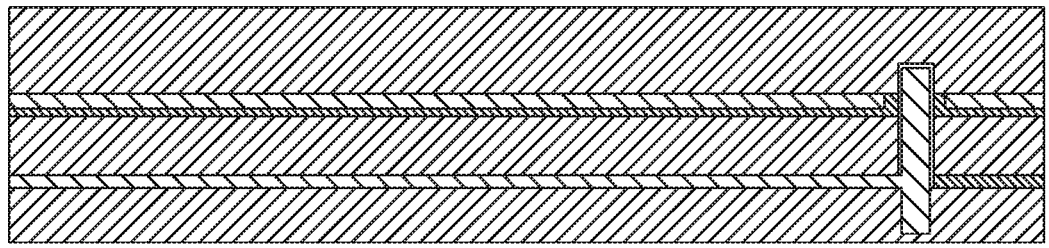
Figure 4D:
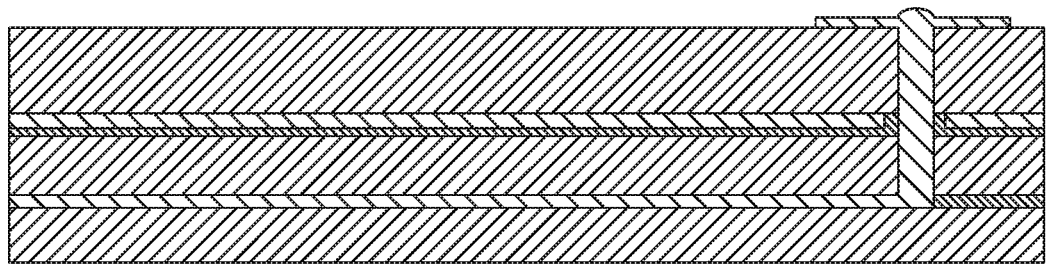

FIGS. 4-4D below, describe structures and techniques to provide a conductive vertical launch that is additive, inexpensive, and removes electro-deposition of copper from the PCB manufacturing process.

Turning now to FIGS. 4-4D, a technique for forming a conductive (e.g., copper) vertical launch (such as vertical launch 22 described above in conjunction with FIG. 1) for coupling an AMT spiral antenna (such as spiral antenna conductors 14a, 14b described above in conjunction with FIG. 1) to an AMT feed circuit (such as feed circuit 26 described above in conjunction with FIG. 1) begins by pre-tinning the bottom trace (feed circuit 26) with a solder bump after the signal trace has been milled out of a double cladded dielectric (FIG. 4).

A hole is provided in the top dielectric layer of the feed and bond film to allow room for solder bump to reflow in the cavity during bonding (FIG. 4A).

A cavity leading to the top layer with the spiral is pre-cut and then the assembly is laminated together (FIG. 4B).

A drilling operation is performed in which a drill bit, or similar structure, is inserted into the pre-formed hole to remove bond film which may have flowed into the area. After drilling to the solder bump, a cylinder of copper is insert until it touches the solder bump down below. It has been found that such a copper cylinder can be at least as small as 5 mils in diameter, which is much smaller than a conventional process can create (FIG. 4C).

A soldering iron having some solder on the end thereof is pressed to the top of the piece of inserted copper. Because of the small distance, heat is conducted down the length of the copper which reflows the solder at the feed layer. Solder from the soldering iron is left on the spiral layer, which forms the connection between the inserted piece of copper and the spiral (FIG. 4D).

As described herein, the Faraday wall is a conductor providing an electromagnetic boundary "vertically" through the substrates. The Faraday wall may be formed by machining a trench through the substrates down to a ground plane and filling the trench with a conductive material, such as a conductive ink applied with additive manufacturing techniques. The conductive ink, when set, may form a substantially electrically continuous conductor. The trench in which the Faraday wall is formed does not have to pierce or go through the ground plane. The Faraday wall may therefore be in electrical contact with the ground plane. Additionally, a top of the Faraday wall may be in electrical contact with another ground plane, which may be accomplished by slight over-filling of the machined trench to ensure contact between the conductive ink and the ground plane and/or by application of solder, for example. Positioning of the Faraday wall may be selected for its influence on signal(s) conveyed by the feed circuit. In various embodiments, a Faraday wall may be positioned to provide isolation without regard to influencing a signal in any particular way other than to provide the isolation.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. An additive manufacturing technique method for fabricating a spiral antenna comprises:
   (a) removing conductive material from an antenna substrate to form two or more conductive spirals on the substrate;
   (b) at a first end of each spiral conductor, forming an opening in the substrate which extends from a first surface to a second opposing surface of the substrate;
   (c) forming an opening which surrounds each of the openings which terminate at a first end of the spiral, said opening having a cylindrical shape; and
   (d) filling each of the opening with a conductive ink so as to form conductive signal paths and conductive walls in the antenna substrate.

2. The method of claim 1, wherein removing conductive material, forming an opening in the substrate, and/or forming an opening which surrounds each of the openings includes a milling technique.

3. The method of claim 1, further comprising forming a conductive vertical launch that is coupled to the spiral antenna and the signal paths.

4. A method of forming a conductive vertical launch that is coupled to a spiral antenna and a feed circuit, the method comprising:
   pre-tinning a bottom trace of a feed circuit with a solder bump after a signal trace has been milled out of a double cladded dielectric substrate;
   drilling a hole in a top layer of the feed circuit and bonding film to allow room for the solder bump to reflow in a cavity during bonding;
   pre-cutting a cavity leading to the top layer with a spiral and laminating the assembly together;
   inserting or filling the hole with copper until the copper touches the solder bump; and
   pressing a top of the copper with a soldering iron to reflow the solder at the feed circuit.

* * * * *